United States Patent
Lee et al.

(10) Patent No.: US 10,782,833 B2
(45) Date of Patent: Sep. 22, 2020

(54) PRESSURE SENSITIVE DISPLAY DEVICE

(71) Applicant: SAMSUNG DISPLAY CO., LTD., Yongin-si, Gyeonggi-do (KR)

(72) Inventors: Choon Hyop Lee, Anyang-si (KR); Ga Yeon Yun, Seoul (KR); Jeong Heon Lee, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/270,003

(22) Filed: Feb. 7, 2019

(65) Prior Publication Data
US 2019/0317621 A1 Oct. 17, 2019

(30) Foreign Application Priority Data
Apr. 16, 2018 (KR) .................... 10-2018-0044139

(51) Int. Cl.
*G06F 3/045* (2006.01)
*G06F 3/044* (2006.01)
*G06F 3/041* (2006.01)
*H01L 27/32* (2006.01)

(52) U.S. Cl.
CPC ............ *G06F 3/044* (2013.01); *G06F 3/0416* (2013.01); *G06F 2203/04105* (2013.01); *H01L 27/3272* (2013.01)

(58) Field of Classification Search
CPC .... G06F 3/0416; G06F 3/04144; G06F 3/041; G06F 3/044; G06F 2203/04103; G06F 2203/04105
See application file for complete search history.

(56) References Cited

U.S. PATENT DOCUMENTS

| | | | | |
|---|---|---|---|---|
| 8,249,661 B2* | 8/2012 | Lee | ........................ | G06F 1/1624 |
| | | | | 455/566 |
| 8,570,298 B2* | 10/2013 | Ikeda | ...................... | G06F 3/044 |
| | | | | 345/174 |
| 9,316,858 B2* | 4/2016 | Yabuta | .............. | G02F 1/133509 |
| 9,582,122 B2* | 2/2017 | Bathiche | ............... | G06F 3/0488 |
| 2014/0043569 A1* | 2/2014 | Yabuta | .................... | G06F 3/041 |
| | | | | 349/104 |
| 2014/0078423 A1* | 3/2014 | Suzuki | ................... | G02B 30/27 |
| | | | | 349/12 |
| 2019/0095005 A1* | 3/2019 | Lee | ......................... | G06F 3/044 |

FOREIGN PATENT DOCUMENTS

KR       101792525      11/2017

* cited by examiner

*Primary Examiner* — Vijay Shankar
(74) *Attorney, Agent, or Firm* — F. Chau & Associates, LLC

(57) ABSTRACT

A display device includes a display panel configured to display an image. A window laces the display panel and includes a transparent display area configured to transmit the image displayed on the display panel therethrough. A non-display area at least partially surrounds the display area. A light-blocking pattern layer is disposed on the non-display area of the window. A touch member is disposed between the display panel and the window and includes a voltage line. A pressure sensing wiring is disposed between the touch member and the window and at least partially overlaps the voltage line. The voltage line and the pressure sensing wiring overlap the light-blocking pattern layer.

21 Claims, 14 Drawing Sheets

PRESSURE SENSITIVE DISPLAY DEVICE

This application claims priority Korean Patent Application No. 10-2018-0044139, filed on Apr. 16, 2018, in the Korean Intellectual Property Office, the disclosure of which is herein incorporated by reference in its entirety.

TECHNICAL FIELD

The present invention relates to a display device and, more specifically, to a pressure sensing display device.

DISCUSSION OF THE RELATED ART

A display device is a device that is capable of displaying images and display devices are widely used in both mobile electronic devices such as smart phones and larger electronic devices such as televisions. While there are various different types of display devise, two common types of display devices include a liquid crystal display (LCD) and an organic light emitting display (OLED).

The display device may include a display area through which an image is displayed and a non-display area disposed around the display area. The display device may be provided with a touch panel for sensing a position of a touch event and a pressure sensor for sensing a pressure of the touch event. While the image may be displayed exclusively within the display area, the touch panel and/or the pressure sensor may be configured to sense a touch event occurring within either the display area or the non-display area.

SUMMARY

A display device includes a display panel configured to display an image. A window faces the display panel and includes a transparent display area configured to transmit the image displayed on the display panel therethrough. A non-display area at least partially surrounds the display area. A pattern layer is disposed on the non-display area of the window. A touch member is disposed between the display panel and the window and includes a voltage line. A pressure sensing wiring is disposed between the touch member and the window and at least partially overlaps the voltage line. The voltage line and the pressure sensing wiring overlap the light-blocking pattern layer.

A display device includes a display panel configured to display an image. A window faces the display panel and includes a transparent display area configured to transmit the image displayed on the display panel therethrough. A non-display area at least partially surrounds the display area. A touch member is disposed between the display panel and the window and includes a voltage line. A pressure sensing wiring is disposed between the touch member and the window and at least partially overlaps the voltage line. An elastic member is disposed between the pressure sensing wiring and the voltage line. A capacitance is formed between the voltage line and the pressure sensing wiring.

A display device includes a display panel having a display area and a non-display area. A touch sensor is disposed over the display panel. The touch sensor includes a voltage line overlapping the non-display area of the display panel. An elastic frame is disposed over the touch sensor. The elastic frame includes a pressure detector overlapping the non-display area of the display panel. A cover element is disposed over the elastic frame. The cover element has a transparent window overlapping with the display area of the display panel and a light blocking pattern overlapping with the non-display area of the display panel. The display panel, the touch sensor, the elastic frame, and the cover element are each bent at two long sides thereof such that the non-display are of the display panel, the voltage line of the touch sensor, the pressure detector of the elastic frame, and the light blocking pattern of the cover element are each bent.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1:
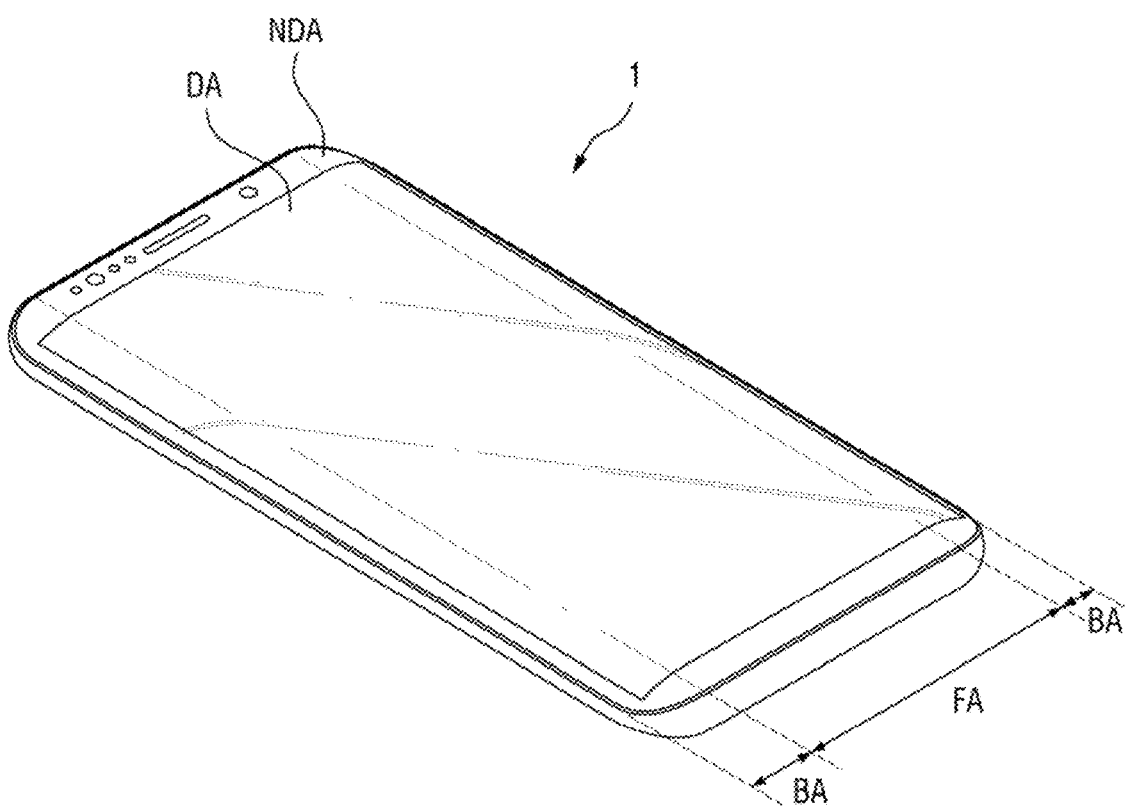
FIG. 1 is a perspective view illustrating a display device according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Where an element is described as being related to another element such as being "on" another element or "located on" a different layer or a layer, includes both a case where an element is located directly on another element or a layer and a case where an element is located on another element via another layer or still another element. In the various figures and description of the invention, the same drawing reference numerals may refer to the same elements.

Although the terms "first, second," and so forth, are used to describe diverse constituent elements, such constituent elements are not limited by the terms. The terms are used only to discriminate a constituent element from other constituent elements. Accordingly, in the following description, a first constituent element may be a second constituent element, etc.

Hereinafter, exemplary embodiments of the present invention will be described with reference to the attached drawings.

A display device, which is a device for displaying an moving image or a still image, can be used as a display screen of various products such as televisions, notebook computers, computer monitors, electronic billboards, smart devices such as the Internet of things, as well as portable electronic devices such as mobile phones, smart phones, tablet personal computers (PCs), smart watches, watch phones, mobile communication terminals, electronic notebooks, electronic books, portable multimedia players (PMPs), navigation systems, and ultra-mobile PCs (UMPCs). Examples of the display device may include an organic light emitting display (OLED), a liquid crystal display (LCD), a plasma display (PDP), a field emission display (FED), and an electrophoretic display (EPD), etc.

Hereinafter, an organic light emitting display device will be described as an example of the display device, but the present invention is not limited thereto.

Figure 2:
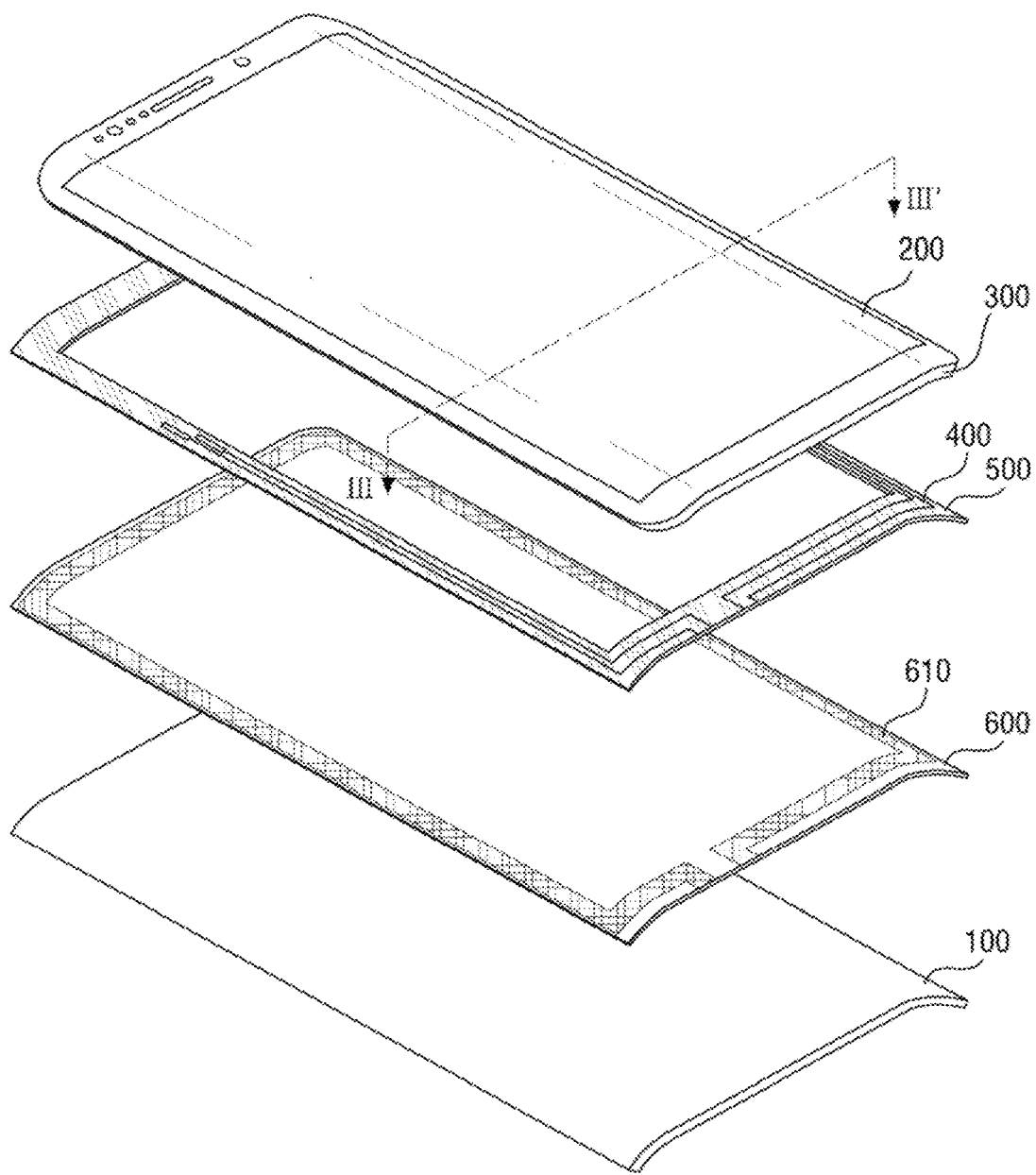
FIG. 2 is an exploded perspective view illustrating the display device of FIG. 1.
Figure 3:
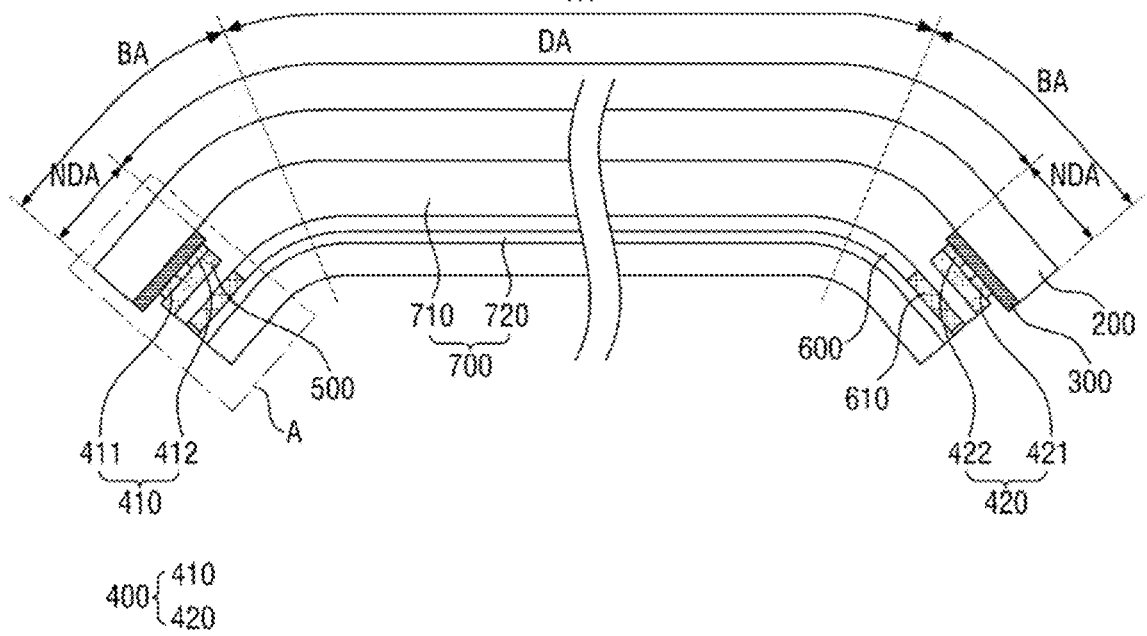
FIG. 3 is a cross-sectional view taken along the line III-III' in FIG. 2.

FIG. 1 is a perspective view of a display device according to an exemplary embodiment of the present invention. FIG. 2 is an exploded perspective view of the display device of FIG. 1. FIG. 3 is a cross-sectional view taken along the line III-III' in FIG. 2.

Referring to FIGS. 1 to 3, a display device 1 includes a display panel 100 and a window 200 disposed over the display panel 100. The display device 1 may further include a touch member 600 disposed between the display panel 100 and the window 200.

Unless defined otherwise, in this specification, the terms "on", "over", "upper side", "upper surface", or "top" refers to a side of a display surface with respect to the display panel 100, and the terms "beneath", "under", "lower side", "lower surface", or "bottom" refers to a side opposite to a display surface with respect to the display panel 100.

The display device 1 may have a predominantly rectangular shape in a plan view. The display device 1 may have two long sides and two short sides. A corner where the long side and short side of the display device 1 meet each other may be a right angle, but may be a curved surface as shown in FIG. 1. The planar shape of the display device 1 may be another shape such as a circular shape or any other arbitrary shape.

In an exemplary embodiment of the present disclosure, the display device 1 may include a flat portion FA and a bending portion BA connected to the flat portion FA and disposed around the flat portion FA. The flat portion FA is generally located on a single plane. The bending portion BA bends from the plane of the flat portion FA. For example, the bending portion BA may be bent or warped in a downward direction from the plane where the flat portion FA is located.

In an exemplary embodiment of the present disclosure, the bending portion BA may include a curved surface curved convexly in the outward direction. According to an exemplary embodiment of the present disclosure, the bending portion BA has a flat surface, and the flat surface of the bending portion BA may be located on a plane having a predetermined angle with respect to the plane of the flat portion FA.

The bending portion BA may be disposed adjacent to one or both of the two long sides of the display device 1. Alternatively, or additionally, the bending portion BA may be disposed adjacent to one or both of the two short sides of the display device 1.

The display device may be a planar display device having only a flat portion without a bending portion. The contents disclosed in the present specification, except those specifically related to the bending portion, may be applied to planar display devices as well as bendable display devices in the same manner.

The display panel 100 is a panel for displaying an image, and for example, an organic light emitting display panel may be applied to the display panel 100. In the following embodiments, an organic light emitting display panel will be applied to the display panel 100. However, the present invention is not limited thereto, and the present disclosure may be applied to other types of display panels such as a liquid crystal display panel and an electrophoretic display panel.

The display panel 100 may be located over the flat portion FA and the bending portion BA.

The display panel 100 includes a plurality of organic light emitting elements arranged on a substrate. The substrate may be a rigid substrate made of glass or the like, or may be a flexible substrate made of polyimide or the like. When the substrate includes polyimide, the display panel 100 may be bent, warped, folded, or rolled.

The window 200 is disposed over the display panel 100. The window 200 protects the display panel 100 and transmits light emitted from the display panel 100 to be seen by a viewer/user. The window may be made of glass or the like.

The window 200 may overlap the display panel 100, and may cover the entire surface of the display panel 100. The window 200 may be larger than the display panel 100. For example, the window 200 may protrude outwardly from the display panel 100 at both short sides of die display device 1. Although the window 200 may also protrude from the display panel 100 at both short sides of the display device 1, the protruding distance of the window 200 at both short sides of the display device may be greater than that of the window 200 at both long sides of the display device 1.

The light-blocking pattern layer 300 may be disposed on the lower surface of the window 200. The light-blocking pattern layer 300 may be printed directly on the window 200, or may be formed as a separately printed layer and then attached to the underside of the window 200.

The light-blocking pattern layer 300 absorbs or reflects light incident from the upper surface and/or the lower surface of an outer boarder/frame of the window 200, so as to shield internal elements of the display device 1 from view and/or to impart a desired color to a bezel of the display device 1. The light-blocking pattern layer 300 may be continuously disposed along the non-display area NDA. For example, the light-blocking pattern layer 300 may be continuously disposed along the edge of the display area DA.

The touch member 600 may be disposed between the display panel 100 and the window 200.

The touch member 600 may be a rigid panel type, a flexible panel type, or a film type. The touch member 600 has substantially the same size and shape as the display panel 100 and overlaps the display panel 100, and the side surface of the touch member 600 is aligned with the side surface of the display panel 100, but the present invention is not limited thereto.

The touch member 600 may detect touches applied to the display area DA of the display device 1. The touch operation may be performed through a part of the user's body, such as a fingertip, or a stylus pen, or the like.

For example, the touch member 600 may be configured to detect touch information, touch position information, and the like.

The touch member 600 may include a base layer, which is an insulating plate or an insulating film, and a touch sensing electrode disposed on the base layer. The base layer may be flexible, and may support an electrode or the like formed on the base layer.

The touch sensing electrode overlaps the display area DA, and may sense the touch operation of a user applied to the display area DA.

The touch member 600 further includes a voltage line 610 formed on the base layer. In some exemplary embodiments of the present disclosure, the voltage line 610 is a reference voltage line, and may be a ground line that is kept in a grounded state.

The voltage line 610 is disposed in the non-display area NDA and is disposed along the edge of the touch member 600. The voltage line 610 may overlap the light-blocking pattern layer 300 so as not to be observable.

In some exemplary embodiments of the present disclosure, the touch member 600 may be omitted. In this case, the touch sensing electrode and the voltage line 610 may be disposed on the display panel 100.

The display panel 100 and the touch member 600 or the touch member 600 and the window 200 may be attached to each other by a transparent bonding layer 700 such as optical clear adhesive (OCA) or optical clear resin (OCR). For example, the window 200 and the touch member 600 may be attached to each other by a first transparent bonding layer 710, and the touch member 600 and the display panel 100 may be attached to each other by a second transparent bonding layer 720.

A pressure detection module 400 may be dispose between the window 200 and the touch member 600.

The pressure detection module 400 may detect a user's input, for example, pressure of a user's finger. For example, the pressure detection module 400 may acquire information about whether pressure has been applied and/or about the intensity of the touch pressure. For example, the pressure detection module 400 may activate or deactivate the display device 1 by the touch operation of a user applied at a specific position. In addition, the pressure detection module 400 may adjust the volume of the display device 1. However, the control content of the display device 1 by the pressure detection module 400 is not limited to the above example.

The pressure detecting module 400 may overlap the non-display area NDA, and the pressure detecting module 400 may be disposed under the light-blocking pattern layer 300. In an exemplary embodiment of the present disclosure, the pressure detection module 400 may be in direct contact with the light-blocking pattern layer 300. Further, the pressure detection module 400 may overlap the voltage line 610 of the touch member 600.

An elastic member 500 may be disposed between the pressure detection module 400 and the touch member 600. The elastic member 500 may be disposed in the non-display area NDA, and the side surface of the elastic member 500 may be aligned with the side surface of the touch member 600.

The elastic member 500 may have a sufficient degree of elasticity so that the elastic member 500 is compressed when pressure is applied and the elastic member 500 returns to its original shape when the pressure is removed. The elastic member 500 may be made of an elastic material. For example, the elastic member 500 may include urethane foam, silicone, and/or other organic materials.

In an exemplary embodiment of the present disclosure, the elastic member 500 may be a double-sided foam tape having its own adhesive force. In this case, the elastic member 500 may include an elastic base and a bonding layer disposed on the upper surface and/or the lower surface of the base. When the elastic member 500 is adhesive on both sides thereof, the elastic member 500 may be in direct contact with the pressure detection module 400 and the touch member 600. In contrast, when the elastic member 500 has an adhesive only on one side thereof, the surface having the adhesive may be in direct contact with the pressure detection module 400, and the aforementioned first transparent bonding layer 710 may be interposed between the elastic member 500 and the adhesive member 600.

Hereinafter, the arrangement of the pressure detection module 400, the elastic member 500, and the voltage line 610 will be described in detail with reference to FIG. 4.

Figure 4:
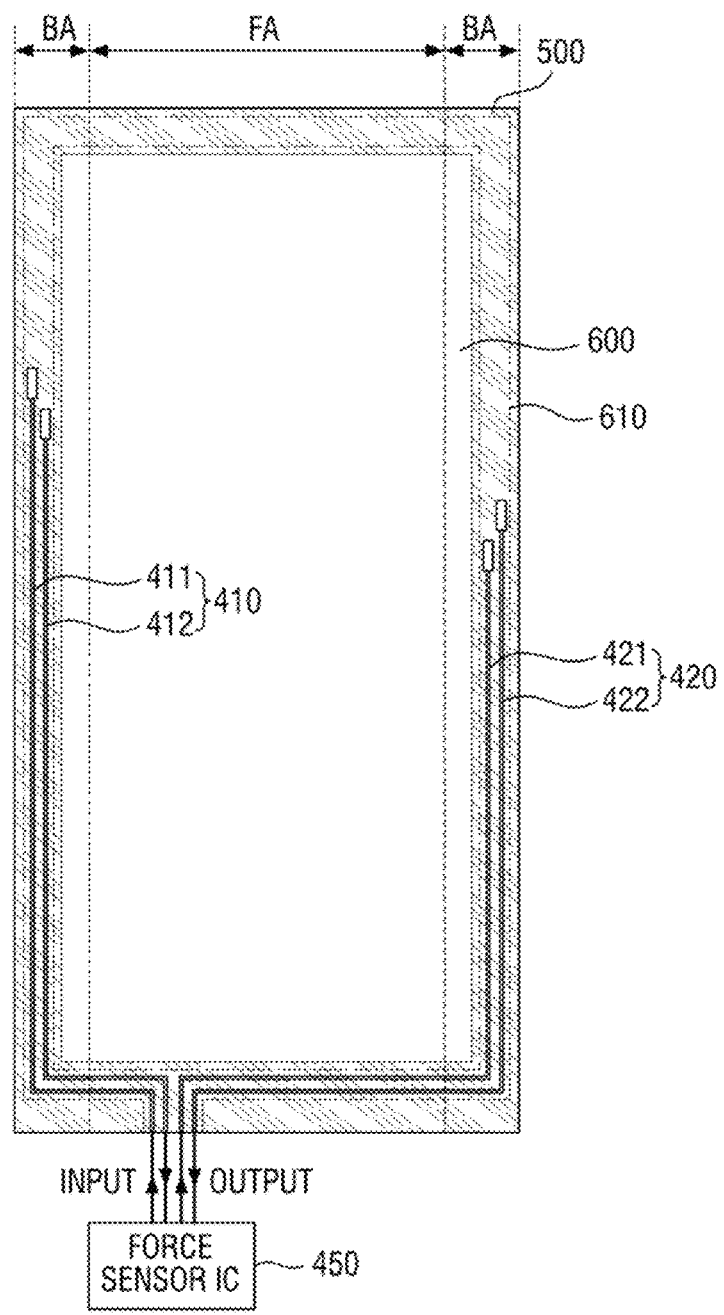
FIG. 4 is a plan view illustrating the arrangement relationship of a pressure detecting module, an elastic member, and a touch member.

FIG. 4 is a plan view illustrating an arrangement of the pressure detecting module, the elastic member, and the touch member.

Referring to FIG. 4, the pressure detection module 400, the elastic member 500, and the touch member 600 may be located over the flat portion FA and the bending portion BA.

The pressure detection module 400, the elastic member 500, and the voltage line 610 may be disposed in the non-display area NDA. For example, the pressure detection module 400, the elastic member 500, and the voltage line 610 overlap the light-blocking pattern layer 300 in the non-display area NDA, and are therefore cannot be seen from the outside of the display device 1.

The pressure detection module 400, the elastic member 500, and the voltage line 610 may overlap each other. In an exemplary embodiment of the present disclosure, the pressure detection module 400 may completely overlap the voltage line 610 of the touch member 600.

The pressure detection module 400 may include a first pressure sensing wiring 410 disposed along one long side of the display device 1 and a second pressure sensing wiring 420 disposed along the other long side thereof.

Each of the first pressure sensing wiring 410 and the second pressure sensing wiring 420 may be electrically connected to a force sensor IC 450. In an exemplary embodiment of the present disclosure, each of the first pressure sensing wiring 410 and the second pressure sensing wiring 420 may include a first input wiring 411 and a second input wiring 421 to which an input signal INPUT is provided from the force sensor IC 450, and a first output wiring 412 and a second output wiring 422 which provide an output signal OUTPUT to the force sensor IC 450.

Each of the input signal INPUT and the output signal OUTPUT may include a current signal and/or a voltage signal, but the present invention is not limited thereto.

Although it is illustrated that the wirings located at the relatively left side in the drawing are the first and second input wiring 411 and 421 and the wirings located at the relatively right side in the drawing are the first and the second output wiring 421 and 422, the present invention is not limited thereto, and the order of arrangement of the input wirings and the output wirings may be changed.

The first input wiring 411 and the first output wiring 412 may extend in the same direction, and may be spaced apart from each other. Similarly, the second input wiring 421 and the second output wiring 422 may also extend in the same direction, and may also be spaced apart from each other. The ends of the first input wiring 411 and the first output wiring 412 may be disposed adjacent to each other. The ends of the second input wiring 421 and the second output wiring 422 may also be disposed adjacent to each other.

The ends of the first pressure sensing wiring 410 and the second pressure sensing wiring 420 may be disposed at each of the long sides of the display device 1, respectively. In a plan view, the end of the first pressure sensing wiring 410 and the end of the second pressure sensing wiring 420 may be disposed at different positions from each other. However, the present invention is not limited thereto, and in a plan view, the end of the first pressure sensing wiring 410 and the end of the second pressure sensing wiring 420 may be disposed along the same line.

Each of the first pressure sensing wiring 410 and the second pressure sensing wiring 420 may include a conductive material having a predetermined electrical resistance. Examples of the conductive material include metal materials such as aluminum, nickel, zinc, copper, and silver. However, the material of each of the first pressure sensing wiring 410 and the second pressure sensing wiring 420 is not limited to the above examples, but each of the first pressure sensing wiring 410 and the second pressure sensing wiring 420 may be formed of a transparent material such as ITO.

The first pressure sensing wiring 410 and the second pressure sensing wiring 420 may be formed directly on the light-blocking pattern layer 300 through a photolithography method or the like. In this case, the first pressure sensing wiring 410 and the second pressure sensing wiring 420 may each be in direct contact with the light-blocking pattern layer 300. However, the manufacturing method of the first pressure sensing wiring 410 and the second pressure sensing wiring 420 is not limited thereto, and may be provided in the form of a wiring layer including a separate base layer.

The elastic member 500 may have a rectangular frame shape having a hollow central portion, and may have a shape extending continuously along the non-display area NDA. When the elastic member 500 is disposed at both long sides and both short sides of the display device 1, a step difference does not occur, so that the durability of the display device 1 can be increased. However, the shape of the elastic member 500 is not limited thereto, and the arrangement of the elastic member 500 at one side may be omitted in consideration of the shape of a display device, the arrangement relationship of other components disposed inside the display device, and the like.

The elastic member 500 may completely overlap the touch member 600. The outer surface of the elastic member 500 may be substantially aligned with the outer surface of the touch member 600, and the inner surface of the elastic member 500 may be disposed on the touch member 600. However, the present invention is not limited thereto, and the outer surface of the elastic member 500 may protrude outwardly from the outer surface of the touch member 600, and may also be disposed on the touch member 600.

The elastic member 500 overlaps the pressure detection module 400 and the voltage line 610. The elastic member 500 may be disposed in a larger area than the pressure detection module 400. For example, the pressure detection module 400 may completely overlap the elastic member 500.

Since the thickness of the elastic member 500 is changed by an external force, the distance between the pressure sensing module 400 and the voltage line 610 may be changed in response to the intensity of an external force. The pressure detection module 400 can detect the presence or absence of pressure and/or the intensity of pressure by sensing such a distance change. Details thereof will be described with reference to FIGS. 5 and 6.

Figure 5:
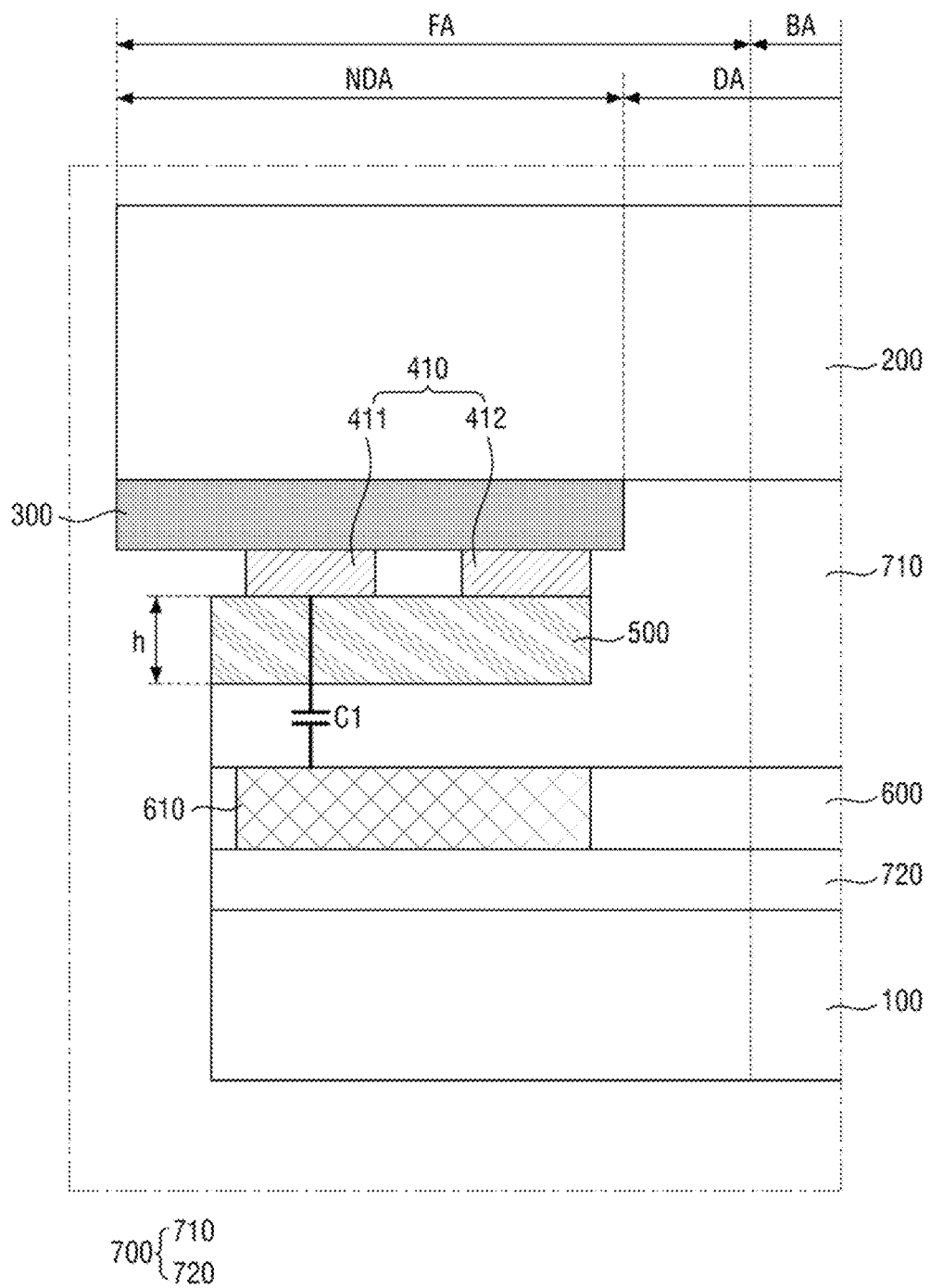
FIG. 5 is an enlarged cross-sectional view illustrating area A in FIG. 3.
Figure 6:
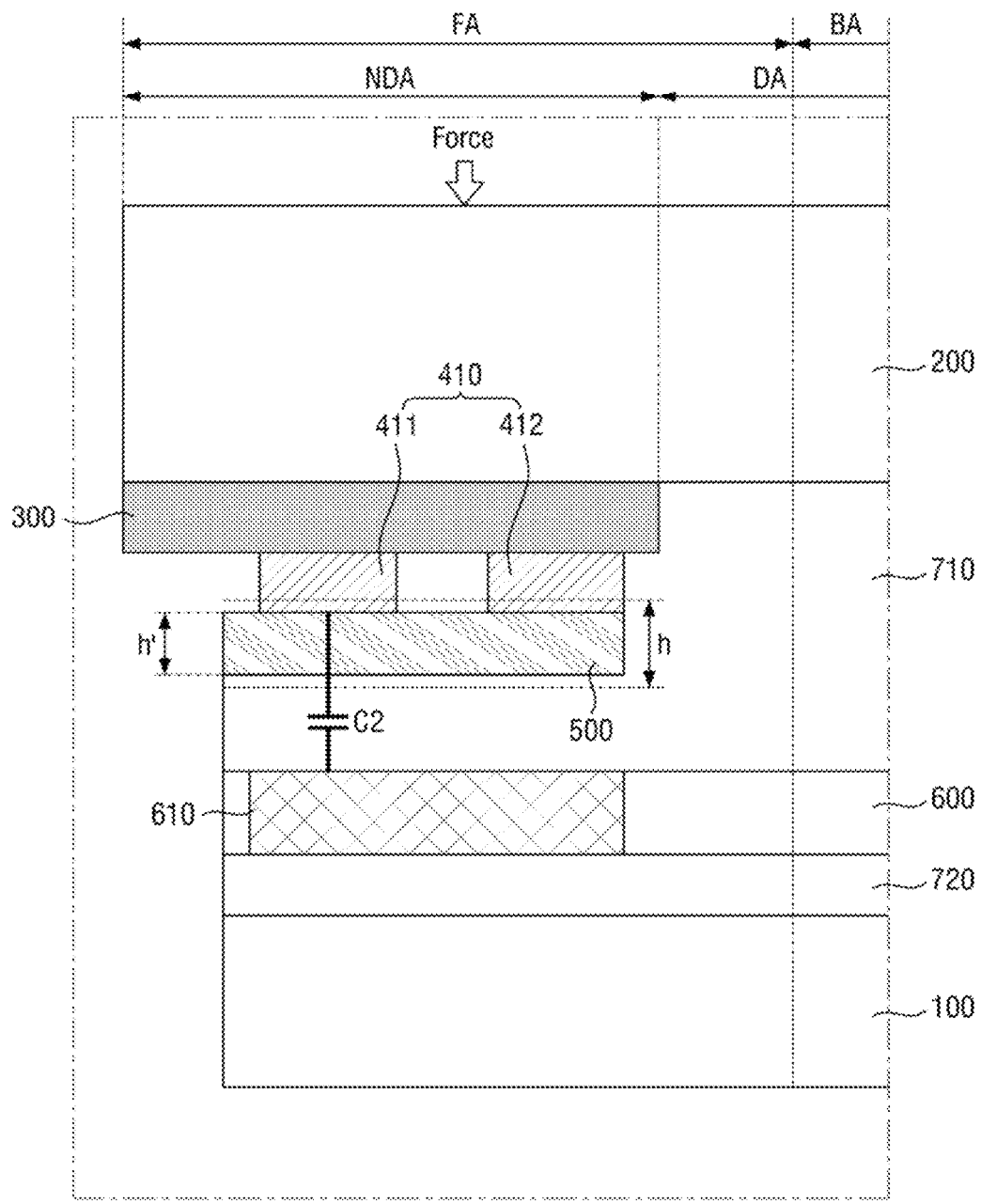
FIG. 6 is a cross-sectional view illustrating the area A when an external force is applied to the display device.

FIG. 5 is an enlarged cross-sectional view of area A in FIG. 3. FIG. 6 is a cross-sectional view showing the area A when an external force is applied to the display device. For convenience of explanation, although it is shown in FIGS. 5 and 6 that the flat portion (FA) and the bending portion (BA) are disposed on the same plane, the corresponding bending portion BA may alternatively have a bent shape as shown in FIG. 3.

The first pressure sensing wiring 410 the voltage line 610, and the elastic member 500 may form a capacitor. For example, when pressure is not applied to the display device 1, a first capacitance C1 may be formed between the first pressure sensing wiring 410 and the voltage line 610. In contrast, when pressure is applied to the display device 1 in the vertical direction, a second capacitance C2 may be formed between the first pressure sensing wiring 410 and the voltage line 610.

The value of the capacitance formed between the first pressure sensing wiring 410 and the voltage line 610 is determined in response to the distance between the first pressure sensing wiring 410 and the voltage line 610 and the dielectric constant of the elastic member 500 disposed therebetween. Accordingly, when pressure (force) is applied to the display device 1 in the vertical direction, the height h' of the elastic member 500 becomes smaller than the height h of the conventional elastic member 500, so that the capacitance between the first pressure sensing wiring 410 and the voltage line 610 is changed from the first capacitance C1 to the second capacitance C2.

In an exemplary embodiment of the present disclosure, the pressure sensing module 400 measures the value of the second capacitance C2, and may acquire information of the position at which pressure is applied, the presence or absence of pressure, and/or the intensity of pressure on the basis of a difference (C1–C2) between the measured value of the second capacitance C2 and the predetermined value of the first capacitance C1.

For example, the pressure detection module 400 can identify the presence and intensity of the pressure applied to the non-display area NDA of the display device 1, thereby activating or deactivating the display device 1. For example, the pressure detection module 400 can perform a function of an existing physical power button. However, the function of the pressure detection module 400 is not limited thereto, and the pressure detection module 400 can perform the same functions as other physical buttons such as a volume control function, as described above.

When the pressure sensing module 400 replaces the function of a physical button, a power supply button disposed at the side surface of the display device 1 may be omitted, so that the bezel area of the display device 1 can be reduced, and the design freedom of the display device 1 can be increased.

The pressure detection module 400 may perform various functions at the same time. For example, the first pressure sensing wiring 410 may determines whether or not the display device 1 is activated, and the second pressure sensing wiring 420 may control the volume of one or more speaker elements.

Generally, a pressure detection member includes a pressure sensing wiring, a voltage line, and a supporting layer for supporting the pressure sensing wiring and the voltage line. The pressure sensing wiring 420 is generally disposed under the display panel 100. In contrast, since the pressure detecting module 400, according to an exemplary embodiment of the present disclosure, utilizes the voltage line 610 of the touch member 600, the overlapping member can be omitted, so that the thickness of the display device 1 can be reduced, and costs can be reduced.

Further, the pressure sensing module 400 is disposed between the display panel 100 and the window 200, thereby increasing pressure sensitivity to more precisely classify user's inputs.

Although the first pressure sensing wiring 410 is described in FIGS. 5 and 6, the second pressure sensing wiring 420, similarly to the first pressure sensing wiring 410, also senses an external force applied to the display device 1.

Hereinafter, display devices according to exemplary embodiments of the present disclosure will be described. In the following embodiments, a description of the same components as those of the previously described embodiment will be omitted or simplified, and differences will be mainly described. Hereinafter, the first pressure sensing wiring is mainly described, but this may be applied to the second pressure sensing wiring.

Figure 7:
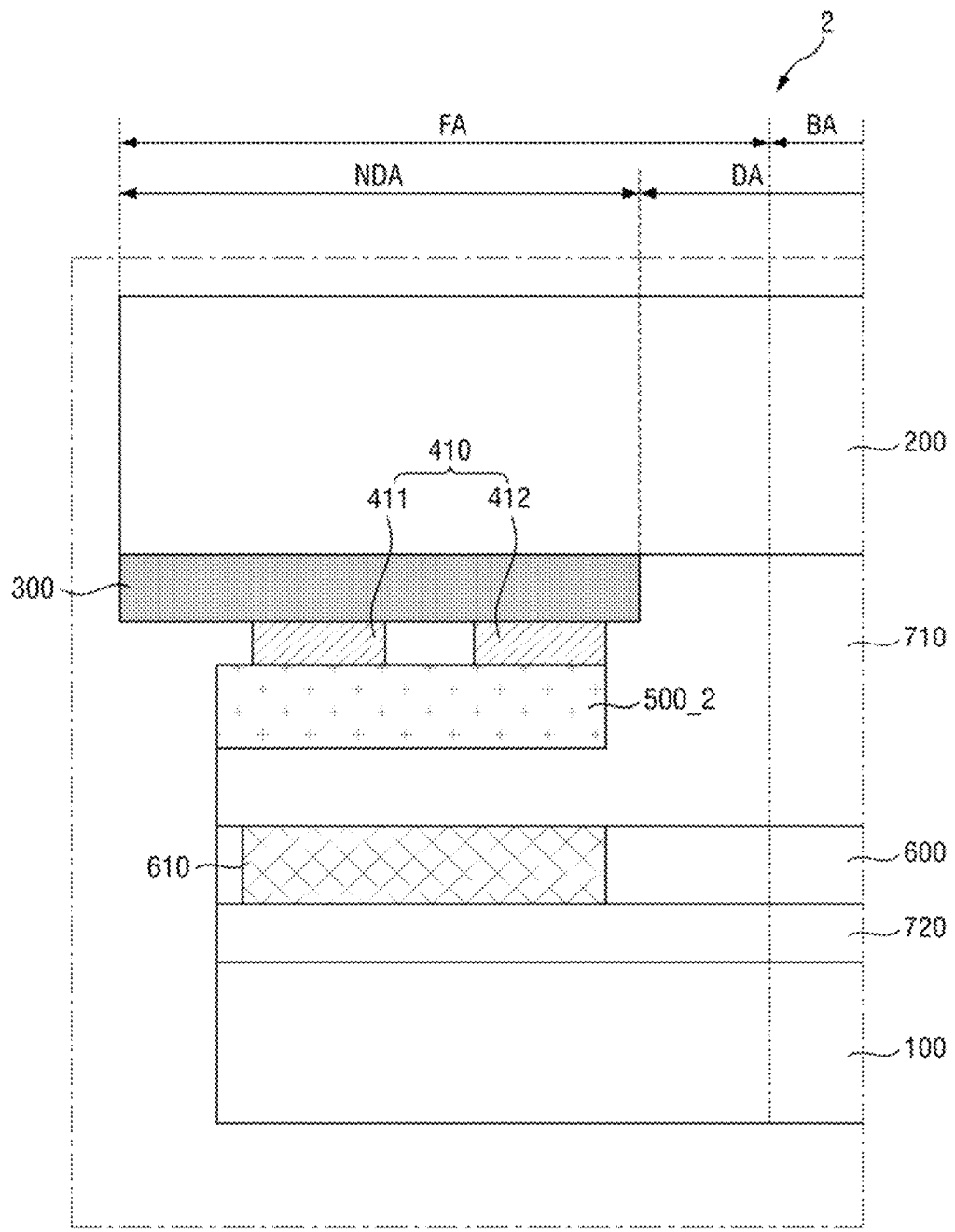
FIG. 7 is a cross-sectional view illustrating a display device according to an exemplary embodiment of the present disclosure.

FIG. 7 is a cross-sectional view of a display device according to an exemplary embodiment of the present disclosure.

Referring to FIG. 7, a display device 2 may include an elastic light-blocking member 500_2.

The light-blocking member 500_2 may be made of a material that can be deformable by an external force, for example, an elastic material. In an exemplary embodiment of the present disclosure, the light-blocking member 500_2 may be a black matrix.

When the external force is applied to the light-blocking member 500_2, as in the case of the elastic member 500, the thickness of the light-blocking 500_2 is changed, so that the value of the capacitance formed between the first pressure sensing wiring 410 and the voltage line 610 may be changed. For example, the light-blocking member 500_2 can perform the same function as the elastic member 500.

The light-blocking member 500_2 may be made of the same material as the light-blocking pattern layer 300. In this case, since the light-blocking member 500_2 can be formed through the same process as the light-blocking pattern layer 300, a material cost, a process facility cost, and the like can be reduced.

Further, since the light-blocking member 500_2 can prevent light from being transmitted to the non-display area NDA, the function of the light-blocking pattern layer 300 can be supplemented.

Figure 8:
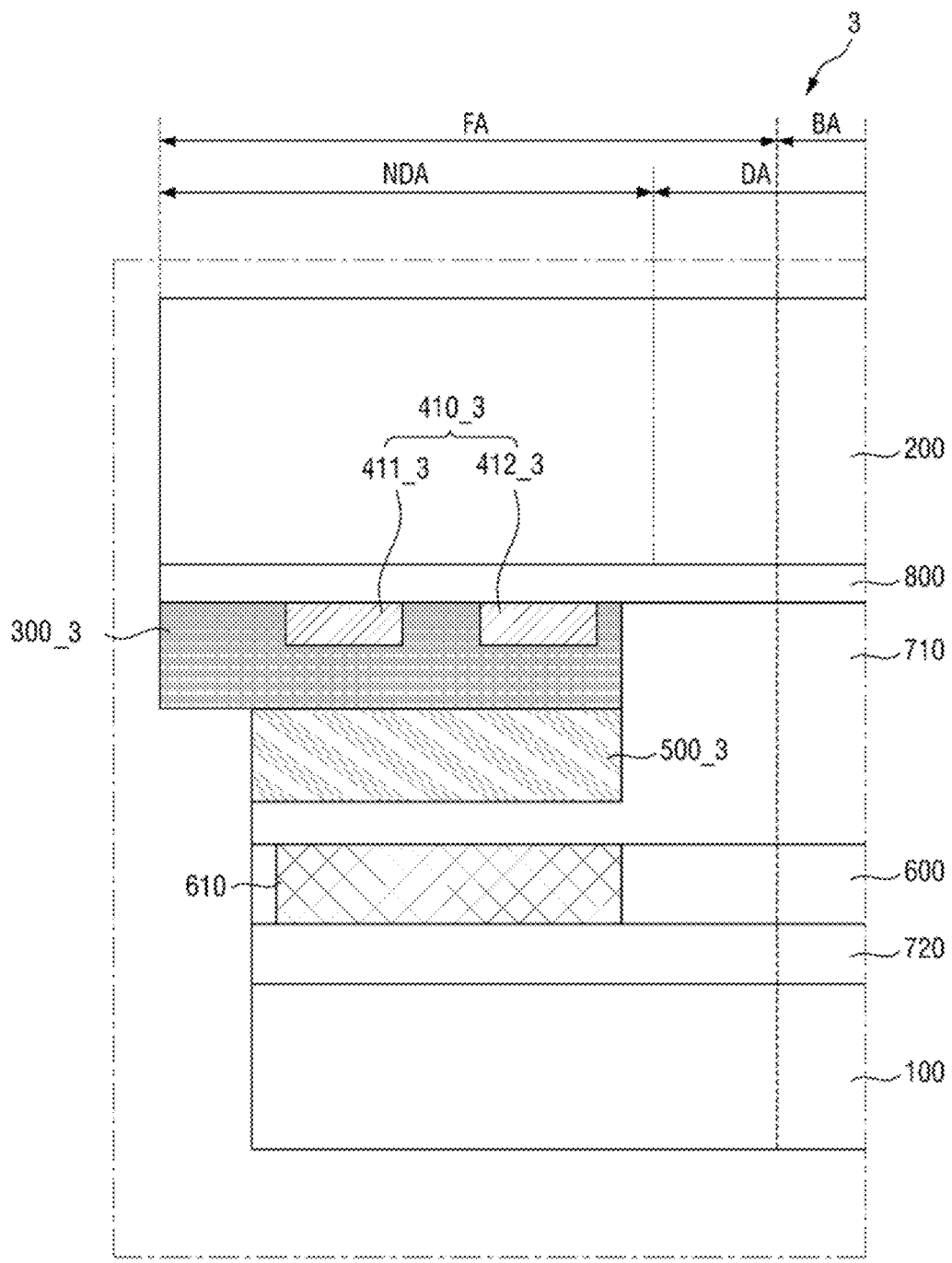
FIGS. 8 and 9 are cross-sectional views of display devices according to exemplary embodiments of the present disclosure.
Figure 9:
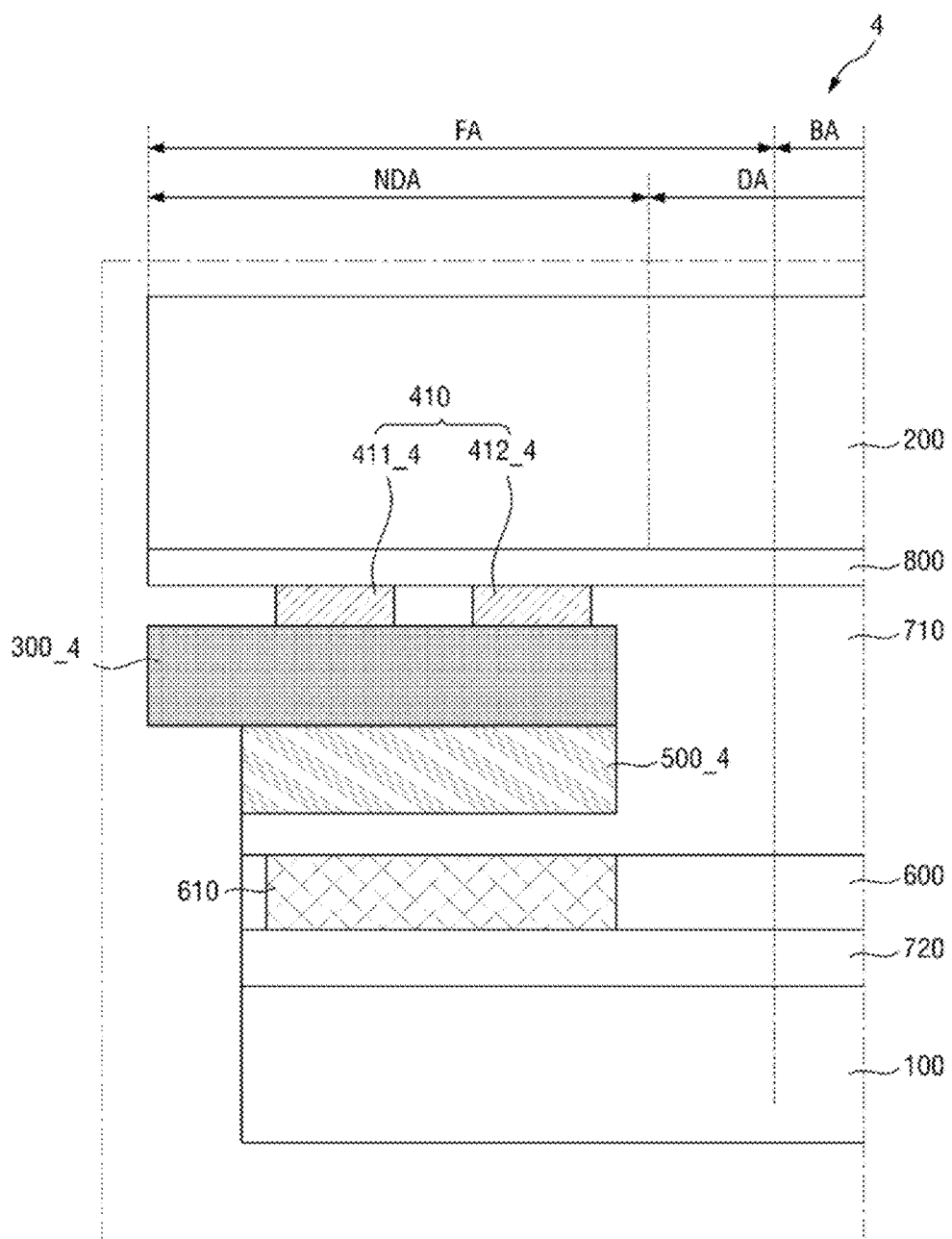

FIGS. 8 and 9 are cross-sectional views of display devices according to exemplary embodiments of the present disclosure.

Referring to FIGS. 8 and 9, a display device 3 or 4 may further include an insulating layer 800 disposed on the lower surface of the window 200. Further, the display device 3 or 4 is different from the display device 1 of FIG. 3 in that a first pressure sensing wire 410_3 or 410_4 is located on a light-blocking pattern layer 300_3 or 300_4.

The first pressure sensing wire 410_3 or 410_4 may be disposed on the insulating layer 800. For example, the first pressure sensing wiring 410_3 or 410_4 may be disposed between the insulating layer 800 and the light-blocking pattern layers 300_3 or 300_4.

As described above, the first pressure sensing wire 410_3 or 410_4 may be formed of a transparent electrode such as an ITO electrode. In this case, the first pressure sensing wire 410_3 or 410_4 might not be visually recognized from the outside of the display device 3 or 4.

An elastic member 500_3 or 500_4 may be disposed beneath the light-blocking pattern layer 300. In an exemplary embodiment of the present disclosure, the light-blocking pattern layer 300 and the elastic member 500_3 or 500_4 may be in direct contact with each other.

The light-blocking pattern layer 300_3 of FIG. 8 may be formed by applying a colored ink layer on the window 200 by a method such as silk printing or pad printing, and drying the applied ink layer. In this case, since the colored ink layer, before being dried, is fluid, each side surface of the first pressure sensing wiring 410_3 may be surrounded. Since the first pressure sensing wiring 410_3 is completely surrounded by the light-blocking pattern layer 300_3, the first pressure sensing wiring 410_3 can be isolated from foreign matter, and it is possible to prevent the first pressure sensing wiring 410_3 from being detached from the insulating layer 800. Thus, the durability and reliability of the display device 3 can be increased.

The light-blocking pattern layer 300_4 of FIG. 9 may be made into a film sheet or the like, and then attached to the window 200 through an adhesive layer. In this case, since the first pressure sensing wiring 410_4 is surrounded by the adhesive layer, similarly to the embodiment of FIG. 8, the first pressure sensing wiring 410_4 can be isolated from foreign matter, and it is possible to prevent the first pressure sensing wiring 410_4 from being detached from the insulating layer 800.

Figure 10:
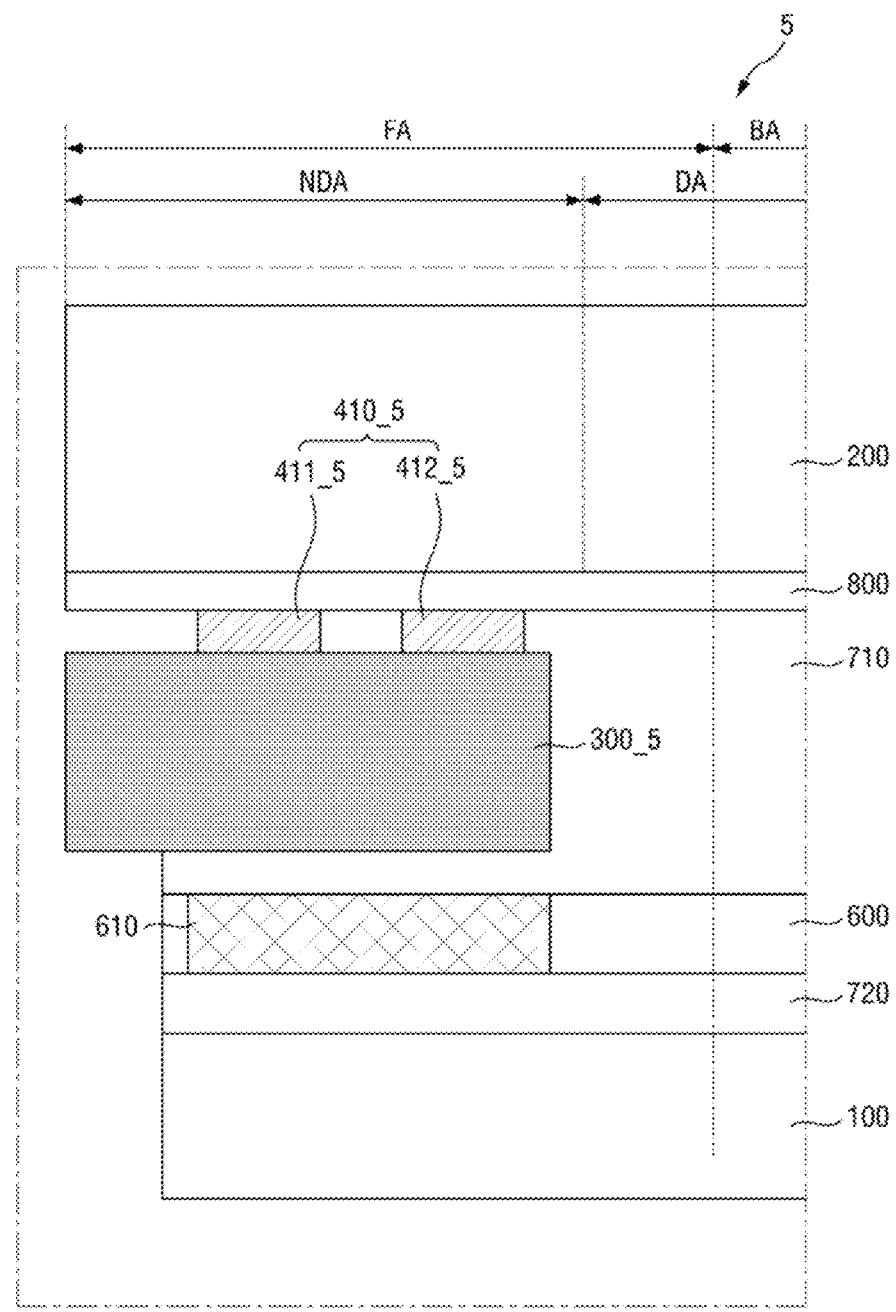
FIG. 10 is a cross-sectional view of a display device according to an exemplary embodiment of the present disclosure.

FIG. 10 is a cross-sectional view of a display device according to an exemplary embodiment of the present disclosure.

Referring to FIG. 10, a light-blocking pattern layer 300_5 of a display device 5 may be made of a material that is deformed by an external force, for example, an elastic material. The thickness of the light-blocking pattern layer 300_5, like the elastic member 500, may be changed when an external force is applied. In this case, since the light-blocking pattern layer 300_5 may replace the function of an existing elastic member 500, the elastic member 500 may be omitted.

The light-blocking pattern layer 300_5 may be thicker than the light-blocking pattern layer 300 of each of the display devices 1 to 4 of FIGS. 1 to 9. The light-blocking pattern layer 300_5 may be formed to have a sufficient thickness to change the value of the capacitance formed between the first pressure sensing wiring 410_5 and the voltage line 610 according to the external force applied to the display device 5.

When only the light-blocking pattern layer 300_5 is disposed between the first pressure sensing wiring 410_5 and the voltage line 610, due to the omission of the elastic member 500, it is possible to reduce a cost and simplify a manufacturing process.

Figure 11:
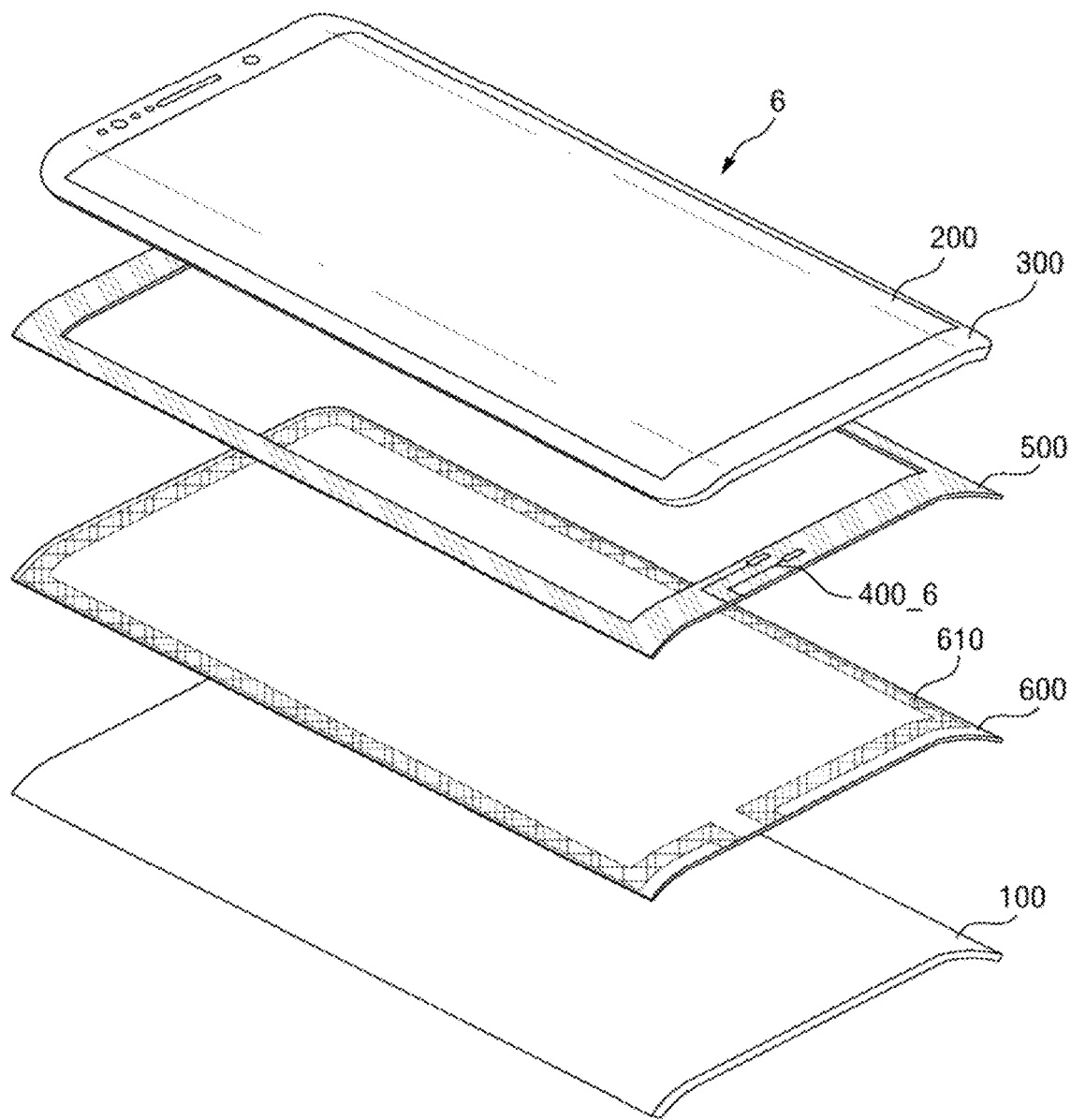
FIG. 11 is an exploded perspective view of a display device according to an exemplary embodiment of the present disclosure.
Figure 12:
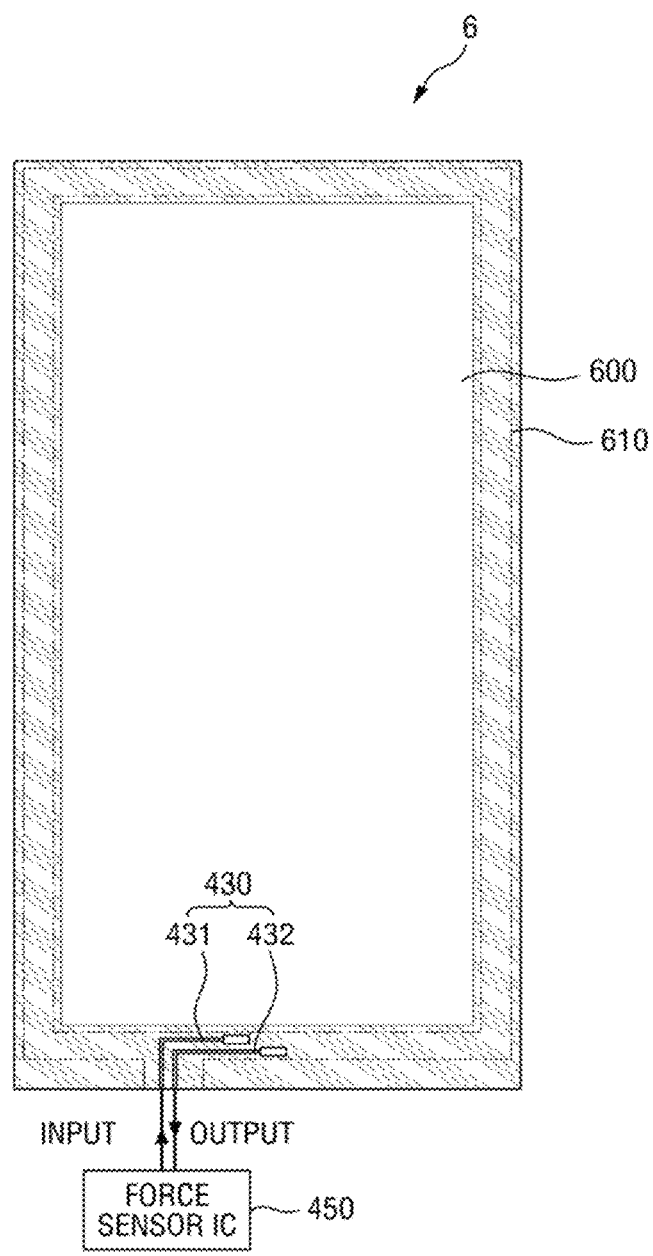
FIG. 12 is a plan view showing the arrangement relationship of a pressure detecting module, an elastic member, and a touch member in FIG. 11.

FIG. 11 is an exploded perspective view of a display device according to an exemplary embodiment of the present disclosure. FIG. 12 is a plan view showing the arrangement relationship of a pressure detecting module, an elastic member, and a touch member in FIG. 11.

Referring to FIGS. 11 and 12, a display device 6 may include a pressure detection module 400_6 including a third pressure sensing wiring 430 disposed at one end thereof.

The third pressure sensing wiring 430 may be disposed at the lower edge of the display device 6. For example, the third pressure sensing wiring 430 may include a third input wiring 431, to which an input signal INPUT is provided from the force sensor IC 450, and a third output wiring 432, which provides an output signal OUTPUT, and the ends of the third input wiring 431 and the third output wiring 432 may be disposed at the lower edge of the display device 6, respectively.

The third pressure sensing wiring 430 may extend along one end of the display device 6, and the end of the third pressure sensing wiring 430 may be disposed on the center line of the display device 6.

The third pressure sensing wiring 430 may perform, for example, a function of a home button of the display device 6.

Although it is shown in FIGS. 11 and 12 that the pressure detection module 400_6 includes only the third pressure sensing wiring 430, the present invention is not limited thereto, and the pressure detection module 400_6 may include both the first pressure sensing wiring 410 and the second pressure sensing wiring 420. Moreover, four or more pressure sensing wirings may be disposed.

The display device 6 may replace all existing physical buttons with the pressure detection module 400_6. In this case, the degree of freedom of external design is increased, and a bezel is reduced, thereby realizing a front display device.

Figure 13:
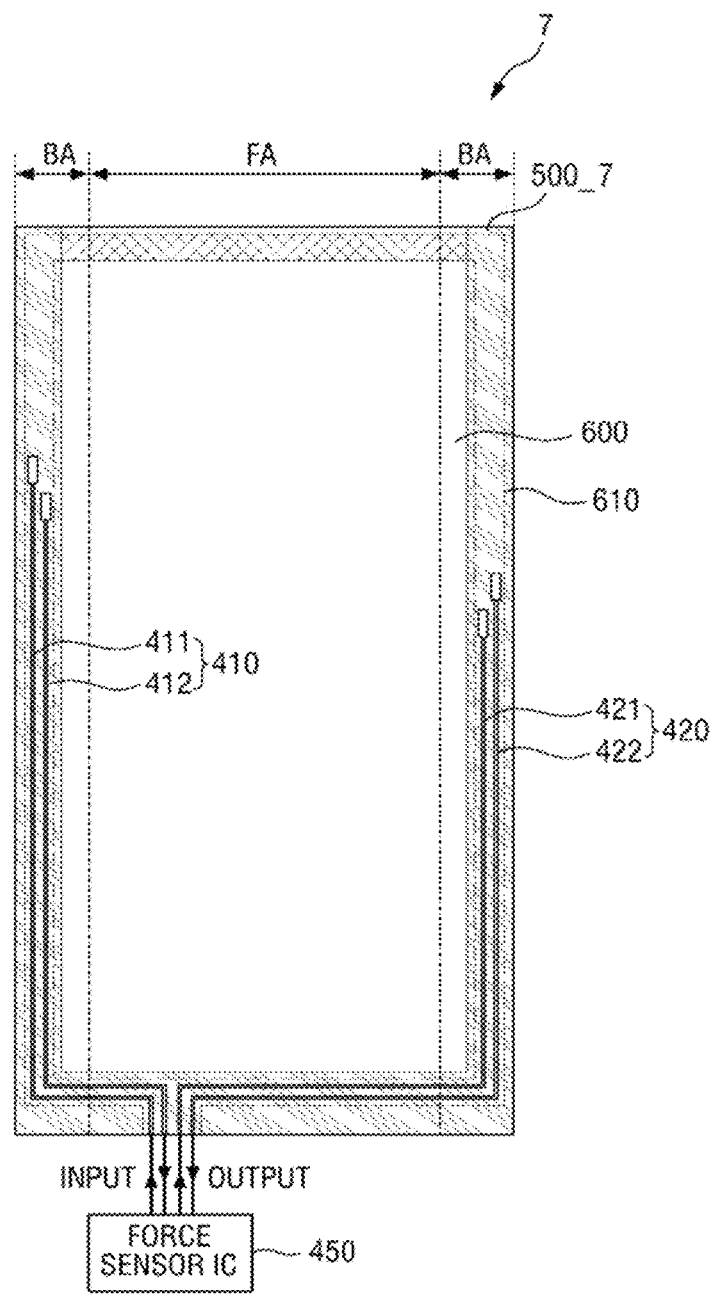
FIGS. 13 and 14 are plan views of display devices according to exemplary embodiments of the present disclosure.
Figure 14:
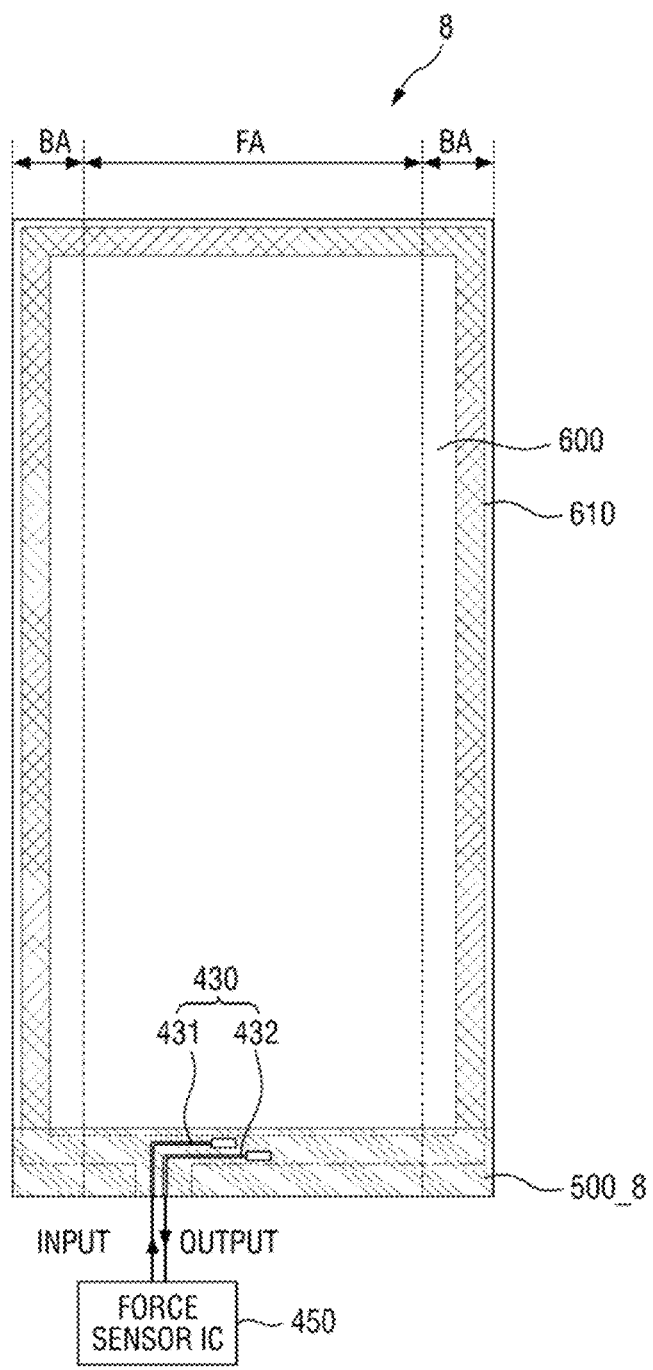

FIGS. 13 and 14 are plan views of display devices according to exemplary embodiments of the present disclosure.

Referring to FIGS. 13 and 14, an elastic member 500_7 or 500_8 of a display device 7 or 8 may be disposed only in an area where the pressure detection module 400.

For example, the elastic member 500_7 of the display device 7 of FIG. 13 may be disposed along both long sides and one of the short sides where the first pressure sensing wiring 410 and the second pressure sensing wiring 420 are disposed, and might not be disposed along the other short side. The voltage line 610 may be exposed at the other short side where the elastic member 500_7 is not disposed.

The elastic member 500_8 of the display device 8 of FIG. 14 may be disposed along one short side where the third pressure sensing wiring 430 is disposed, and might not be disposed along either of the long sides or the other short side. In this case, the voltage line 610 may be exposed at both long sides and the other short side where the elastic member 500_8 is not disposed.

As described above, according to exemplary embodiments of the present invention, there can be provided a display device in which the non-display area is reduced.

Further, according to exemplary embodiments of the present invention, there can be provided a display device that includes both a touch panel and a pressure sensor while being thin.

The effects of the present invention are not limited by the foregoing, and other various effects are anticipated herein.

Although exemplary embodiments of the present invention have been disclosed for illustrative purposes, those skilled in the art will appreciate that various modifications, additions and substitutions are possible, without departing from the scope and spirit of the invention.

What is claimed is:

1. A display device, comprising:
a display panel comprising a display area and a non-display area;
a touch sensor disposed over the display panel, the touch sensor including a voltage line overlapping the non-display area of the display panel;
an elastic frame disposed over the touch sensor, the elastic frame including a pressure detector overlapping the non-display area of the display panel; and
a cover element disposed over the elastic frame, the cover element having a transparent window overlapping with the display area of the display panel and a light blocking pattern overlapping with the non-display area of the display panel,
wherein the display panel, the touch sensor, the elastic frame, and the cover element are each bent at two long sides thereof such that the non-display area of the display panel the voltage line of the touch sensor, the pressure detector of the elastic frame, and the light blocking pattern of the cover element are each bent.

2. A display device, comprising:
a display panel configured to display an image;
a window facing the display panel and including a transparent display area configured to transmit the image displayed on the display panel therethrough and a non-display area at least partially surrounding the display area;
a light-blocking pattern layer disposed on the non-display area of the window;
a touch member disposed between the display panel and the window and including a voltage line; and
a pressure sensing wiring disposed between the touch member and the window and at least partially overlapping the voltage line, in a cross-sectional view,
wherein the voltage line and the pressure sensing wiring overlap the light-blocking pattern layer, in the cross-sectional view.

3. The display device of claim 2, further comprising: an elastic member disposed between the pressure sensing wiring and the voltage line.

4. The display device of claim 3, wherein the elastic member is configured to change thickness in response to pressure applied to the display device.

5. The display device of claim 4, wherein the elastic member is a light-blocking member.

6. The display device of claim 3, wherein the elastic member has a rectangular flame, shape continuously extending along an edge of the touch member and the elastic member does not overlap the display area.

7. The display device of claim 4, wherein the touch member further includes a base layer and a touch sensing electrode formed on the base layer, and the voltage line is formed on the base layer.

8. The display device of claim 2, wherein the light-blocking pattern layer is disposed between the window and the pressure sensing wiring.

9. The display device of claim 2, wherein the light-blocking pattern layer is disposed between the pressure sensing wiring and the touch member.

10. The display device of claim 9, further comprising: an insulating layer disposed on the window, wherein the pressure sensing wiring is disposed on the insulating layer.

11. The display device of claim 9, wherein the pressure sensing wiring includes a transparent electrode.

12. The display device of claim 2, wherein the pressure sensing wiring includes a first electrode and a second electrode each extending along one long side of the window.

13. The display device of claim 12, further comprising: a force sensor IC providing an input signal to the first electrode and receiving an output signal from the second electrode.

14. The display device of claim 2, wherein an end of the pressure sensing wiring is disposed on one long side of the window.

15. The display device of claim 2, wherein an end of the pressure, sensing wiring is disposed on one short side of the window.

16. A display device, comprising:

a display panel configured to display an image;

a window facing the display panel and including a transparent display area configured to transmit the image displayed on the display panel therethrough and a non-display area at least partially surrounding the display area;

a touch member disposed between the display panel and the window and including a voltage line;

a pressure sensing wiring disposed between the touch member and the window as d at least partially overlapping the voltage line, in a cross-sectional view; and an elastic member disposed between the pressure sensing wiring and the voltage line, wherein a capacitance is formed between the voltage line and the pressure sensing wiring.

17. The display device of claim 16, wherein the elastic member is configured to change thickness in response to pressure applied to the display device.

18. The display device of claim 17, wherein a value of the capacitance is dependent upon the thickness of the elastic member.

19. The display device of claim 18, wherein external pressure is sensed using a change in the value of the capacitance.

20. The display device of claim 16, wherein the voltage line, the pressure sensing wiring, and the elastic member are each disposed in the non-display area.

21. The display device of claim 16, wherein the touch member further includes:

a base layer; and a touch sensing electrode formed on the base layer, wherein the voltage line is formed on the base layer.

* * * * *